(12) United States Patent
Suhir

(10) Patent No.: US 6,460,753 B1
(45) Date of Patent: Oct. 8, 2002

(54) BI-MATERIAL ASSEMBLY ADHESIVELY BONDED AT THE ENDS AND FABRICATION METHOD

(75) Inventor: Ephraim Suhir, Randolph, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/703,292

(22) Filed: Nov. 1, 2000

(51) Int. Cl.[7] .............................................. H01L 21/50

(52) U.S. Cl. ............... 228/123.1; 228/175; 228/180.22; 428/198; 156/291; 156/292

(58) Field of Search ........................ 428/198; 228/123.1, 228/175, 180.22

(56) References Cited

U.S. PATENT DOCUMENTS 5,001,531 A * 3/1991 Yamaguchi et al. .......... 357/25
5,553,769 A * 9/1996 Ellerson et al. .......... 228/123.1

OTHER PUBLICATIONS

Suhir, E., "Predicted Thermal Mismatch Stresses in a Cylindrical Bi-material Assembly Adhesively Bonded at its Ends", Journal of Applied Mechanics, vol. 64, pp 15–22, Mar. 1994.
Suhir, E., "Approximate Evaluation of the Interfacial Shearing Stress in Circular Double Lap Shear Joints, with Application to Dual Coated Optical Fibers", Int. J. of Solids and Structures, vol. 31, No. 23, pp 3261–3283, 1994.

* cited by examiner

Primary Examiner—Cathy Lam

(57) ABSTRACT

A bi-material assembly comprising two adherends, adhesively bonded. The assembly is adhesively bonded in an area consisting of a length of 2l at each end of the bonded assembly. The interface of the adherends is not completed bonded so that 2l is less than half of the assembly length. Each bonded area has an inner edge. The inner edge local interfacial shearing stress is substantially equal in magnitude to the inner edge global interfacial shearing stress causing the strength of the bi-material bonded assembly to be substantially the same as a like structure wherein 2l substantially equals half the assembly length. Further are a method of fabricating a bi-material assembly, and a semiconductor device and fabrication method.

11 Claims, 12 Drawing Sheets

Bi-material assembly, adhesively bonded at the ends

Bi-material assembly, adhesively bonded at the ends

Adhesively bonded bi-material assembly, subjected to the change in temperature: interfacial shearing stress Adhesively bonded bi-material assembly, subjected to the change in temperature: normal forces in the adherends Adhesively bonded bi-material assembly, subjected to the change in temperature: interfacial "peeling" stresses Adhesively bonded bi-material assembly,
subjected to external shear:
normal stresses in the adherends and the
interfacial shearing stress Adhesively bonded bi-material assembly,
subjected to external shear:
interfacial "peeling" stresses FIG. 9  Bi-material Assembly Bonded at the Ends:
Interaction of "Local" and "Global" Thermal Stress

| stress | | t (mm) | 0.194 | 0.387 | 0.774 | 1.161 | 1.548 | 1.935 | 2.322 | 3.87 | 12.386 |
|---|---|---|---|---|---|---|---|---|---|---|---|
| Interfacial shearing stress (psi) | Local | $-\ell$ | −234 | −441 | −726 | −863 | −920 | −941 | −949 | −954 | −954 |
| | | $+\ell$ | 234 | 441 | 726 | 863 | 920 | 941 | 949 | 954 | 954 |
| | Global | $-\ell$ | −1947 | −834 | −265 | −96 | −35 | −13 | −5 | 0 | 0 |
| | | $+\ell$ | −2195 | −1287 | −999 | −962 | −956 | −954 | −954 | −954 | −954 |
| | Total | $-\ell$ | −2181 | −1275 | −992 | −959 | −955 | −954 | −953 | −954 | −954 |
| | | $+\ell$ | −1962 | −847 | −272 | −99 | −36 | −13 | −5 | 0 | 0 |
| Interfacial peeling stress (psi) | Local | $-\ell$ | 12 | 3 | −16 | −16 | −11 | −10 | −9 | −9 | −9 |
| | | $+\ell$ | 12 | 3 | −16 | −16 | −11 | −10 | −9 | −9 | −9 |
| | Global | $-\ell$ | 4077 | 450 | −40 | 174 | 551 | 481 | 78 | 485 | −11 |
| | | $+\ell$ | −4326 | −1297 | −781 | −427 | −60 | −139 | −541 | −132 | −728 |
| | Total | $-\ell$ | 4089 | 853 | −56 | 158 | 539 | 471 | 69 | 476 | −120 |
| | | $+\ell$ | −4314 | −1294 | −797 | −443 | −72 | −149 | −551 | −141 | −737 |
| Displacement at x=t (μm) | Local | | −0.063 | −0.118 | −0.195 | −0.231 | −0.246 | −0.252 | −0.254 | −0.255 | −0.255 |
| | Global | | 0.588 | 0.345 | 0.267 | 0.258 | 0.256 | 0.256 | 0.256 | 0.255 | 0.255 |
| | Total | | 0.525 | 0.227 | 0.072 | 0.027 | 0.01 | 0.004 | 0.002 | 0 | 0 |

NUMERICAL DATA

Change in temperature $\Delta t = 100°C$
$L_0 = 0.9449$ in

Silicon: $E_0 = 17.5 \times 10^6$ psi, $v_0 = 0.24$, $\alpha_0 = 3.2 \times 10^{-6}/°C$ Ceramic Base: $E_1 = 57.0 \times 10^6$ psi, $v_1 = 0.22$, $\alpha_1 = 6.5 \times 10^{-6}/°C$ Adhesive: $E_a = 0.4 \times 10^6$ psi, $v_a = 0.4$, $\alpha_a = 90.0 \times 10^{-6}/°C$

BI-MATERIAL ASSEMBLY ADHESIVELY BONDED AT THE ENDS AND FABRICATION METHOD

FIELD OF THE INVENTION

The invention relates to semiconductor devices and more particularly to devices comprising bi-material assemblies adhesively bonded at the ends.

BACKGROUND OF THE INVENTION

Thermal stresses contribute significantly to the finite service life of microelectronic and photonic components and devices. These stresses can lead to mechanical (structural), and functional (electrical or optical) failure. Therefore, the ability to predict and possibly minimize the thermal stresses and displacements in a microelectronic or photonic assembly is important.

In particular, large chips (for example 2"×2") are typically adhesively bonded to a substrates such as ceramic to provide mechanical strength and protect solder joints. Traditionally the entire chip under-surface is coated with adhesive. For large chips it may be difficult to cover the entire surface. Reduction in coverage may lead to a decrease in mechanical stability of the bonded area, particularly when the assembly is subjected to temperature changes. Accordingly, a method is needed to determine the ideal bonding area without jeopardizing mechanical strength.

Modeling thermal stress in structures, comprised of dissimilar materials has been performed using structural analysis and theory-of-elasticity methods. Both approaches have been employed to model the mechanical behavior of bonded joints, including microelectronics and photonics packaging. The specific needs described above have not been addressed by these methods.

SUMMARY OF THE INVENTION

A bi-material assembly comprising two adherends, adhesively bonded is disclosed. The assembly is adhesively bonded in an area consisting of a length of 2l at each and of the bonded assembly. The interface of the adherends is not completely bonded so that 2l is less than half of the assembly length. Each bonded area has an inner edge. The inner edge local interfacial shearing stress is substantially equal in magnitude to the inner edge global interfacial shearing stress causing the strength of the bi-material bonded assembly to be substantially the same as a like structure wherein 2l substantially equals half the assembly length.

Further disclosed are a method of fabricating a bi-material assembly, and a semiconductor device and fabrication method.

DESCRIPTION OF THE DRAWINGS

FIG. 9 depicts a table of local and global stresses for varying l values.

DETAILED DESCRIPTION OF THE INVENTION

Interfacial shearing and "peeling" stresses in an elongated bi-material assembly, adhesively bonded at the ends and subjected to the change in temperature, may be predicted, based on an approximate structural analysis (strength-of-materials) model. The stresses in the bonded joints due to the thermal expansion (contraction) mismatch of the adherend materials within the bonded areas ("local" mismatch stresses), as well as the stresses in these joints, caused by the thermal mismatch of the adherend materials within the unbonded midportion of the assembly ("global" mismatch stresses), may be considered, and the interaction of the "local" and the "global" stresses evaluated and analyzed. Advantageously, if the bonded joints are made long enough, the maximum stresses in the assembly may not be different from the stresses in an assembly with a continuous adhesive layer, for substantially any length of unbonded midportion of the assembly. This phenomenon may be used advantageously in stress-strain evaluations and mechanical ("physical") design of bi-material assemblies in electronic and photonic packaging.

Figure 1:
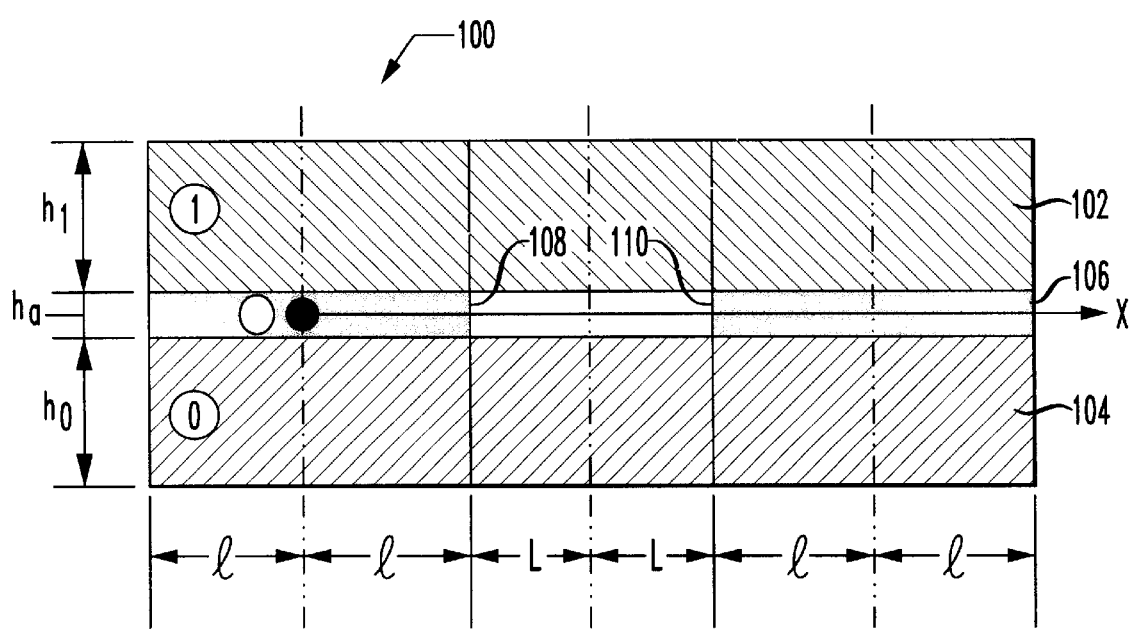
FIG. 1 depicts a bi-material assembly adhesively bonded at the ends according to an illustrative embodiment of the invention.

FIG. 1 depicts an elongated bi-material assembly 100 having two adherends 102 and 104 bonded by adhesive layer 106. The structural analysis approach is applied to evaluate the thermally induced stresses in an elongated bi-material assembly 100, adhesively bonded at the ends and subjected to the change in temperature. An analytical stress model is developed for the evaluation of the thermally induced stresses in the bonded joints of an elongated bi-material assembly 100 adhesively bonded at the ends. These stresses are substantially due to the thermal expansion (contraction) mismatch of assembly 100 components within the bonded areas ("local" mismatch), and within the inner, unbonded, portion of assembly 100 ("global" mismatch). Based on the developed models, the total thermal stresses in the bonded joints due to the combined action (interaction) of the "local" and the "global" thermal stresses are evaluated. Considered are the interfacial shearing and "peeling" (i.e. normal stresses, acting in the through-thickness direction of assembly 100) stresses, affecting the adhesive and the cohesive strength of the bonding material, as well as the maximum longitudinal relative shearing displacements of adherends 102 and 104. These displacements can be used as a criterion of the level of the shearing load applied to the solder joints located within the unbonded midportion of assembly 100. Using the obtained solution, the minimum required lengths of the bonded areas are established, so that the induced stresses and displacements in assembly 100 will be substantially equal to those in an assembly with a continuous adhesive layer. If this is achieved, the strength of the bonded joints and the solder joint interconnections may not be compromised, despite the fact that the adhesive material does not cover the entire interface.

Analysis

1. Assumptions

The following assumptions are used in this study:

Structural analysis (strength-of-materials) approach can be applied to evaluate the stresses and the displacements.

Adherend 102 and 104 can be treated, from the standpoint of structural analysis, as elongated rectangular plates, experiencing small deflections, and the engineering theory of bending of plates, such as is described in S. P. Timoshenko and S. Woinowsky-Krieger, "Theory of Plates and Shells", $2^{nd}$ ed., McGraw-Hill, 1959, and E. Suhir, "Structural Analysis in Microelectronics and Fiber-Optics Systems", Van-Nostrand Reinholds, New York, 1991 can be used to evaluate the stresses and the displacements.

The interfacial shearing stresses can be determined without considering the effect of "peeling" such as described in E. Suhir, "Approximate Evaluation of the Elastic Interfacial Stresses in Thin Films, with Application to High-$T_c$ Superconducting Ceramics", *Int. Journal of Solids and Structures,* vol. 2, No. 8, 1991, and V. Mishkevich and E. Suhir, "Simplified Engineering Approach for the Evaluation of Thermally Induced Stresses in Bi-Material Microelectronic Structures", *Int. Journal of Microelectronic Packaging,* vol. 1, 1998.

Adhesive layer 106 is very thin, compared to the thicknesses of adherends 102 and 104, and its Young's modulus is considerably lower than the Young's moduli of the adherend materials; because of that, the adhesive material experiences shearing deformations only, and the coefficient of thermal expansion of this material need not be accounted for.

The interfacial shearing stresses in assembly 100 can be found, based on an assumption that the longitudinal interfacial displacements of adherends 102 and 104 within the bonded areas can be represented as the sum of 1) unrestricted (stress-free) displacements; 2) thermally induced displacements (these displacements can be evaluated, using Hooke's law, under an assumption that they do not change across the thicknesses of adherends 102 and 104, i.e. are the same for all the points of the given cross-section of the assembly component); 3) corrections, which account for the fact that, in reality, the interfacial displacements of adherends 102 and 104 are somewhat larger than the displacements of the inner points of the cross-section; 4) displacements due to the assembly bow.

The corrections, which consider the nonuniform distribution of the longitudinal (axial) displacements in the through-thickness direction, are proportional to the interfacial shearing stress in the given cross-section and are not affected by the stresses and strains in the adjacent cross-sections.

The longitudinal axial compliances, $\lambda_0$ and $\lambda_1$, and the longitudinal interfacial compliances, $\kappa_0$ and $\kappa_1$, of adherends 102 and 104 can be evaluated by the formulas:

$$\lambda_0 = \frac{1}{E_0^* h_0}, \lambda_1 = \frac{1}{E_1^* h_1}, \kappa_0 = \frac{h_0}{3G_0}, \kappa_1 = \frac{h_1}{3G_1}, \tag{1}$$

where $h_0$ and $h_1$ are the thicknesses of adherends 104 and 102, respectively, as depicted in FIG. 1.

$$E_0^* = \frac{E_0}{1-v_0^2}, E_1^* = \frac{E_1}{1-v_1^2} \tag{2}$$

are the effective Young's moduli, of the adherend materials, $E_0$ and $E_1$ are the Young's moduli of these materials, $v_0$ and $v_1$ are their Poisson's ratios, and $$G_0 = \frac{E_0}{2(1+v_0)}, G_1 = \frac{E_1}{2(1+v_1)} \tag{3}$$

are the shear moduli of the adherend materials.

The interfacial compliance of adhesive layer 106 can be computed by the formula $$\kappa_a = \frac{2h_a}{3G_a}, \tag{4}$$

where $h_a$ is the thickness of adhesive layer 106 as depicted in FIG. 1.

$$G_a = \frac{E_a}{2(1+v_a)} \tag{5}$$

is the shear modulus of the material, $E_a$ is its Young's modulus and $v_0$ is Poisson's ratio.

The formulas (1) and (4) are obtained under an assumption that the lengths of adherends 102 and 104 within the bonded area are considerably larger than their thicknesses.

The interfacial shearing stresses in, and the bow, w(x) of, assembly 100 as a whole can be found, assuming that the deflections, $w_0(x)$ and $w_1(x)$, of adherends 102 and 104 are not different:

$$w_0(x)=w_1(x)=w(x). \tag{6}$$

The interfacial "peeling" stress is proportional to the difference of the deflections, $w_1(x)$ and $w_0(x)$, of adherends 102 and 104 at the given cross-section:

$$w_1(x)-w_0(x)=\delta p(x), \tag{7}$$

where the through-thickness compliance, $\delta$, of assembly 100 can be evaluated as $$\delta = \frac{h_0}{E_0^*} + \frac{h_1}{E_1^*} + \frac{2h_a}{E_a^*}, \text{ and} \tag{8}$$

$$E_a^* = \frac{E_a}{1-v_a^2} \tag{9}$$

is the effective Young's modulus of the adhesive material.

Adhesively Bonded Assembly Subjected to the Change in Temperature ("Local" Thermally Induced Stresses)

Figure 2A:
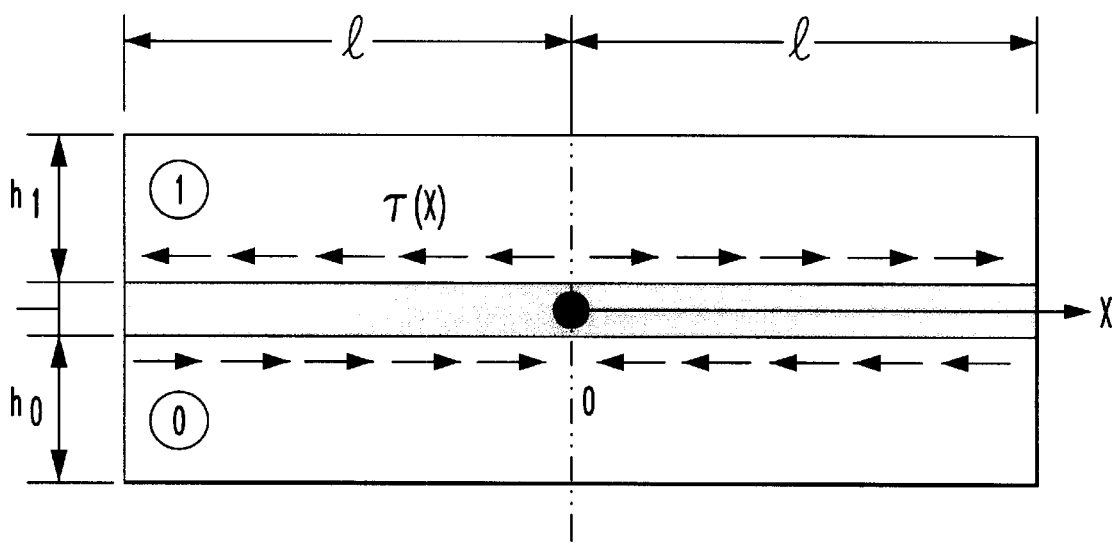
FIGS. 2a–c depict an adhesively bi-material assembly, subjected to a temperature change according to an illustrative embodiment of the invention.
Figure 2B:
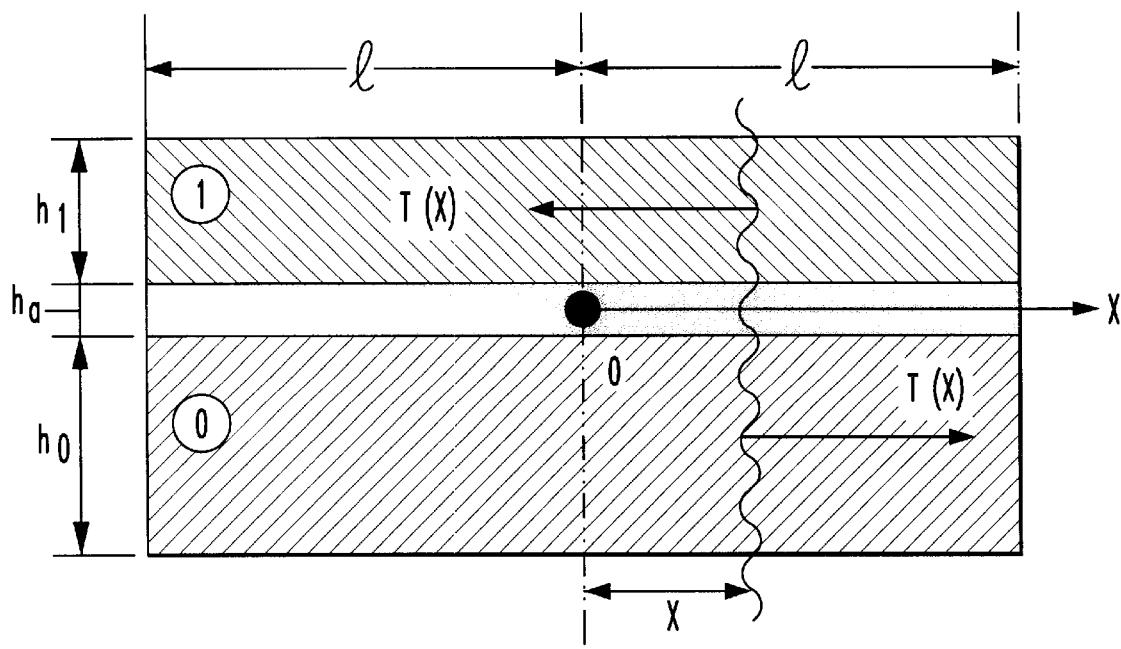
Figure 2C:
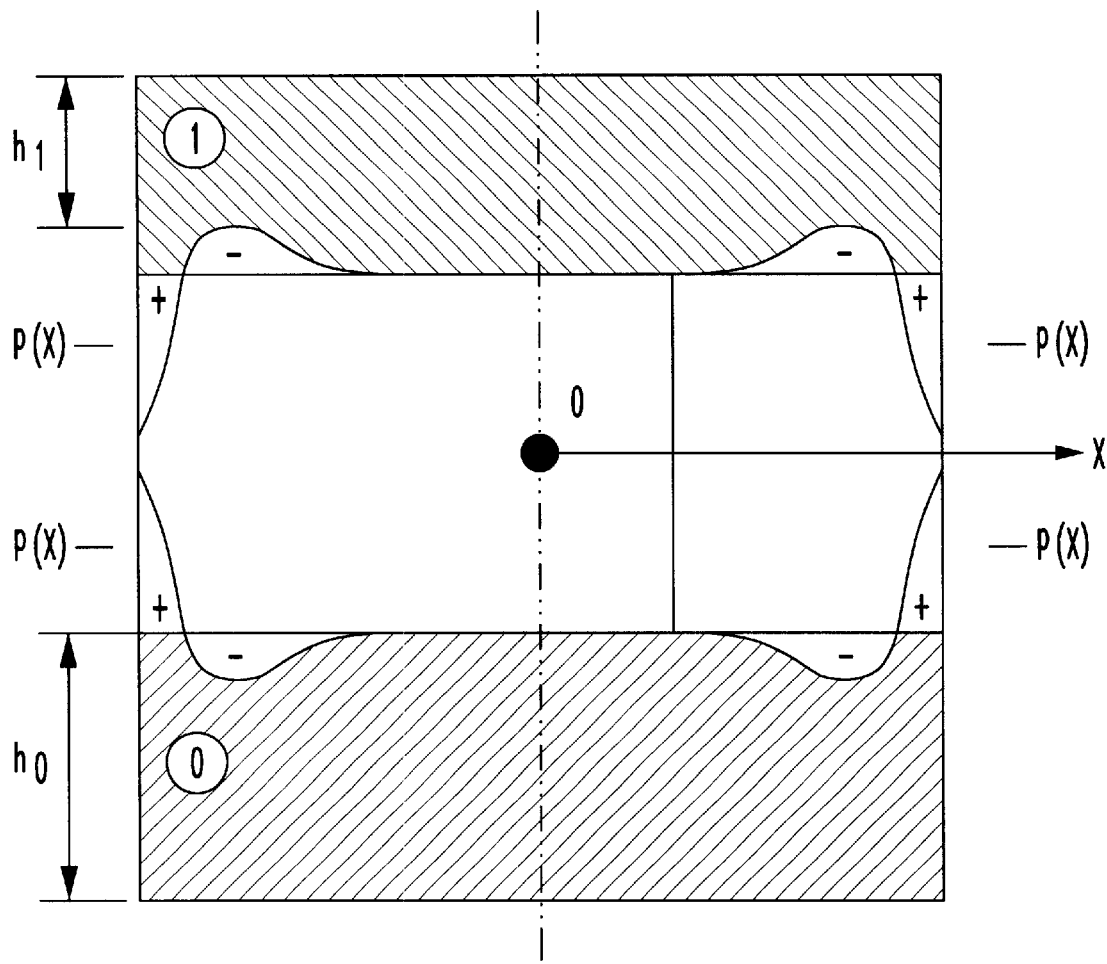

For an elongated adhesively bonded bi-material assembly, as depicted in FIGS. 2a–c, manufactured at an elevated temperature and subsequently cooled down to a lower temperature, the longitudinal interfacial displacements of the adherend plates can be expressed, in accordance with the above assumptions, by the formulas:

$$u_0(x) = -\alpha_0 \Delta t x + \lambda_0 \int_0^x T(\xi)d\xi - \kappa_0 \tau(x) - \frac{h_0}{2}w'(x)$$
$$u_1(x) = -\alpha_1 \Delta t x - \lambda_1 \int_0^x T(\xi)d\xi + \kappa_1 \tau(x) + \frac{h_1}{2}w'(x)$$
(10)

where $\alpha_0$ and $\alpha_1$ are the coefficients of thermal expansion (contraction) of the adherend materials; $\Delta t$ is the change in temperature; $\lambda_0$ and $\lambda_1$ are the axial compliances of the adherends, expressed by the first two formulas in (1); $\kappa_0$ and $\kappa_1$ are their interfacial compliances, which are expressed by the last two formulas in (1);

$$T(x) = \int_{-l}^{x} \tau(\xi)d\xi \quad (11)$$

are the thermally induced axial forces in the adherends (in tension or compression); $\tau(x)$ is the interfacial shearing stress; $l$ is half the length of a bonded portion; $h_0$ and $h_1$ are the thicknesses of the adherends; and $w(x)$ is the deflection function of the assembly. The origin, o, of the coordinate, x, is located in the mid-cross-section of the assembly at the interface.

The condition $$u_0(x) - u_1(x) = \kappa_a \tau(x) \quad (12)$$

of the compatibility of the displacements, $u_0(x)$ and $u_1(x)$, results in the following equation for the function $T(x)$:

$$\kappa \tau(x) - (\lambda_0 + \lambda_1)\int_0^x T(\xi)d\xi + \frac{h_0 + h_1}{2}w'(x) = \Delta\alpha \Delta t x, \quad (13)$$

where $\Delta\alpha = \alpha_1 - \alpha_0$ is the difference in the coefficients of thermal expansion of the adherends, and $$\kappa = \kappa_0 + \kappa_1 + \kappa_a \quad (14)$$

is the total interfacial compliance of the assembly. From the formula (11) we have:

$$\tau(x) = T'(x), \quad (15)$$

and the equation (13) results in the following equation for the unknown functions $T(x)$ and $w(x)$:

$$\kappa T'(x) - (\lambda_0 + \lambda_1)\int_0^x T(x) + \frac{h_0 + h_1}{2}w'(x) = \Delta\alpha \Delta t. \quad (16)$$

Since there are no external axial forces, nor concentrated bending moments, applied at the ends $x = \pm l$ of the assembly, the following boundary conditions should be fulfilled:

$$T(\pm l) = 0, \quad w''(\pm l) = 0. \quad (17)$$

These conditions can be written, considering the relationship (15) and the equation (16), as follows:

$$T''(\pm l) = \tau'(\pm l) = \frac{\Delta\alpha \Delta t}{\kappa}. \quad (18)$$

The equations of bending of the adherend plates are:

$$D_0 w_0''(x) = \int_{-l}^{x}\int_{-l}^{x} p(\xi)d\xi d\xi_1 - \frac{h_0}{2}T(x)$$
$$D_1 w_1''(x) = -\int_{-l}^{x}\int_{-l}^{x} p(\xi)d\xi d\xi_1 - \frac{h_1}{2}T(x)$$
(19)

where $p(x)$ is the interfacial "peeling" stress, and $$D_0 = \frac{E_0^* h_0^3}{12}, \quad D_1 = \frac{E_1^* h_1^3}{12} \quad (20)$$

are the flexural rigidities of the adherends. The equations (19), considering the assumption (6), result in the following formula for the assembly curvature:

$$w''(x) = -\frac{h_0 + h_1}{2D}T(x), \quad (21)$$

where $$D = D_0 + D_1 \quad (22)$$

is the effective flexural rigidity of the assembly. Introducing the formula (21) into the equation (16), the following differential equation for the function $T(x)$ is obtained:

$$T''(x) - k^2 T(x) = \frac{\Delta\alpha \Delta t}{\kappa}. \quad (23)$$

where $$k = \sqrt{\frac{\lambda}{\kappa}} \quad (24)$$

is the parameter of the interfacial shearing stress, and $$\lambda = \lambda_0 + \lambda_1 + \frac{(h_0 + h_1)^2}{4D} \quad (25)$$

is the axial compliance of the assembly, with consideration of the effect of bending.

The equation (23) has the following solution:

$$T(x) = C_0 + C_1 \sin hkx + C_2 \cos hkx, \quad (26)$$

where $C_0$, $C_1$ and $C_2$ are the constants of integration. Introducing this solution into the equation (23), provides:

$$C_0 = -T_\infty = -\frac{\Delta\alpha \Delta t}{k^2 \kappa} = -\frac{\Delta\alpha \Delta t}{\lambda}. \quad (27)$$

Since the function $T(x)$ must be symmetric with respect to the mid-cross-section, $x = 0$, of the assembly, one should put $C_1 = 0$. The constant $C_2$ can be determined from the boundary conditions (18) as follows:

$$C_2 = \frac{\Delta\alpha \Delta t}{\lambda}\frac{1}{\cosh kl} = \frac{T_\infty}{\cosh kl}. \quad (28)$$

so that the solution (26) yields:

$$T(x) = -\frac{\Delta\alpha\Delta t}{\lambda}\left(1 - \frac{\cosh kx}{\cosh kl}\right) = -T_\infty\left(1 - \frac{\cosh kx}{\cosh kl}\right). \quad (29)$$

The shearing stress local interfacial shearing can be found, considering the relationship (15) as follows:

$$\tau(x) = T'(x) = k\frac{\Delta\alpha\Delta t}{\lambda}\frac{\sinh kx}{\cosh kl}. \quad (30)$$

The condition (7) yields:

$$w_1''(x) - w_0''(x) = \delta p''(x). \quad (31)$$

Then, using the equations (19) and the condition (31), provides the following equation for the "peeling" stress function, p(x):

$$p''(x) + 4\beta^4 \int_{-l}^{x}\int_{-l}^{x} p(\xi)d\xi d\xi' = \mu T(x), \quad (32)$$

where $$\beta = \sqrt[4]{\frac{D}{4\delta D_0 D_1}}, \quad \mu = \frac{h_0 D_1 - h_1 D_0}{2\delta D_0 D_1}. \quad (33)$$

As evident from the equation (32) and the second formula in (33), no "peeling" stress can possibly occur, if the thickness and the elastic constants of the adherends are chosen in such a way that[19]

$$h_0 D_1 = h_1 D_0, \quad (34)$$

so that the condition of zero "peeling" stress is as follows:

$$\frac{E_0^*}{E_1^*} = \frac{h_1^2}{h_0^2}. \quad (35)$$

From the equation (32) and the expression (30):

$$p^{IV}(x) + 4\beta^4 p(x) = \mu\tau'(x) = \mu\frac{\Delta\alpha\Delta t}{\kappa}\frac{\cosh kx}{\cosh kl}. \quad (36)$$

The equation (36) for the "peeling" stress function, p(x), has the form of the equation of bending of a beam lying on a continuous elastic foundation, and therefore, the solution to this equation can be sought in the form[20]:

$$p(x) = A_0 V_0(\beta x) + A_1 V_1(\beta x) + \quad (37)$$

$$A_2 V_2(\beta x) + A_3 V_3(\beta x) + \frac{\mu}{k_4 + 4\beta^4}\frac{\Delta\alpha\Delta t}{\kappa}\frac{\cosh kx}{\cosh kl},$$

where $A_i$, I=0, 1, 2, 3, are the constants of integration, and the functions $V_i(\beta x)$, I=0, 1, 2, 3, are expressed as follows:

$$\left.\begin{array}{l} V_0(\beta x) = \cosh\beta x \cos\beta x, \\ V_1(\beta x) = \frac{1}{\sqrt{2}}(\cosh\beta x \sin\beta x + \sinh\beta x \cos\beta x), \\ V_1(\beta x) = \sinh\beta x \sin\beta x, \\ V_3(\beta x) = \frac{1}{\sqrt{2}}(\cosh\beta x \sin\beta x - \sinh\beta x \cos\beta x), \end{array}\right\} \quad (38)$$

These functions obey the following rules of differentiation:

$$\left.\begin{array}{l} V_0'(\beta x) = -\beta\sqrt{2}\,V_3(\beta x),\; V_1'(\beta x) = -\beta\sqrt{2}\,V_0(\beta x) \\ V_2'(\beta x) = -\beta\sqrt{2}\,V_1(\beta x),\; V_3'(\beta x) = -\beta\sqrt{2}\,V_2(\beta x) \end{array}\right\} \quad (39)$$

The "peeling" stress function, p(x), must be symmetric with respect to the mid-cross-section, x=0, of the assembly. Accordingly, $A_1=A_3=0$ should be used in the solution (37). Since there are substantially no concentrated bending moments, nor concentrated lateral forces, acting at the assembly ends x=±l, the following boundary conditions should be fulfilled for the deflection functions, $w_0(x)$ and $w_1(x)$:

$$w_0''(\pm l) = w_1''(\pm l) = 0,\; w_0'''(\pm l) = w_1'''(\pm l) = 0. \quad (4)$$

These conditions can be translated, using the relationship (7), into the following boundary conditions for the function p(x):

$$p''(l) = 0,\; p'''(l) = 0. \quad (41)$$

Introducing the solution (37), with $A_1=A_3=0$, into the conditions (41) and solving the obtained equations for the constants $A_0$ and $A_2$, yields:

$$\left.\begin{array}{l} A_0 = \mu\dfrac{k^4\sqrt{2}}{(k^4+4\beta^4)\beta^2}T_\infty\dfrac{k}{\beta\sqrt{2}}V_0(\beta l)\tanh kl + \dfrac{V_3(\beta l)}{\sinh 2\beta l + \sin\beta l} \\ A_2 = \mu\dfrac{k^4\sqrt{2}}{(k^4+4\beta^4)\beta^2}T_\infty\dfrac{k}{\beta\sqrt{2}}V_2(\beta l)\tanh kl - \dfrac{V_1(\beta l)}{\sinh 2\beta l + \sin 2\beta l} \end{array}\right\}, \quad (42)$$

and the solution (37) results in the following formula for the interfacial "peeling" stress:

$$p(x) = \mu\frac{k^4\sqrt{2}}{k^4+4\beta^4}T_\infty\left\{\frac{k^2\sqrt{2}}{\beta^2}\left[\frac{\frac{k}{\beta\sqrt{2}}V_0(\beta l)\tanh kl + V_3(\beta l)}{\sinh 2\beta l + \sin 2\beta l}V_0(\beta x) + \right.\right.$$

$$\left.\left.\frac{\frac{k}{\beta\sqrt{2}}V_2(\beta l)\tanh kl - V_1(\beta l)}{\sinh 2\beta l + \sin 2\beta l}V_2(\beta x)\right] + \frac{\cosh kx}{\cosh kl}\right\}. \quad (43)$$

Here $T_\infty$ is the force acting in the midportion of a sufficiently long and/or stiff assembly. This force is expressed by the formula (27).

In the case of a long (large l value) and/or stiff (large k and β values) assembly, the formulas (29), (30) and (43) yield:

$$T(x) \approx -T_{2\delta}[1-e^{-k(l-x)}], \quad (44)$$

$$\tau(x) \approx \tau_{max}e^{-k(l-x)}, \quad (45)$$

$$p(x) = \mu \frac{k^2}{k^4 + 4\beta^4} T_\infty \quad (46)$$

$$\left\{ \frac{k^2}{2\beta^2} e^{-\beta(l-x)} \left[ \sin(\beta(l-x)) + \left(\frac{k}{\beta} - 1\right) \cos(\beta(l-x)) \right] + e^{-k(l-x)} \right\}.$$

Here $$\tau_{max} = kT_\infty = k\Delta\alpha\Delta \frac{t}{\lambda} = \frac{\Delta\alpha\Delta t}{k\kappa} \quad (47)$$

is the maximum shearing stress at the edge of such an assembly. The "peeling" stress at the edge of a long and/or stiff assembly can be evaluated by the following simplified formula:

$$p(l) = \mu \frac{k^2}{k^4 + 4\beta^4} T_\infty \left[ \frac{k^2}{2\beta^2} \left(\frac{k}{\beta} - 1\right) + 1 \right]. \quad (48)$$

Adhesively Bonded Assembly, Subjected to External Shearing Load ("Global" Thermally Induced Stresses)

Figure 3A:
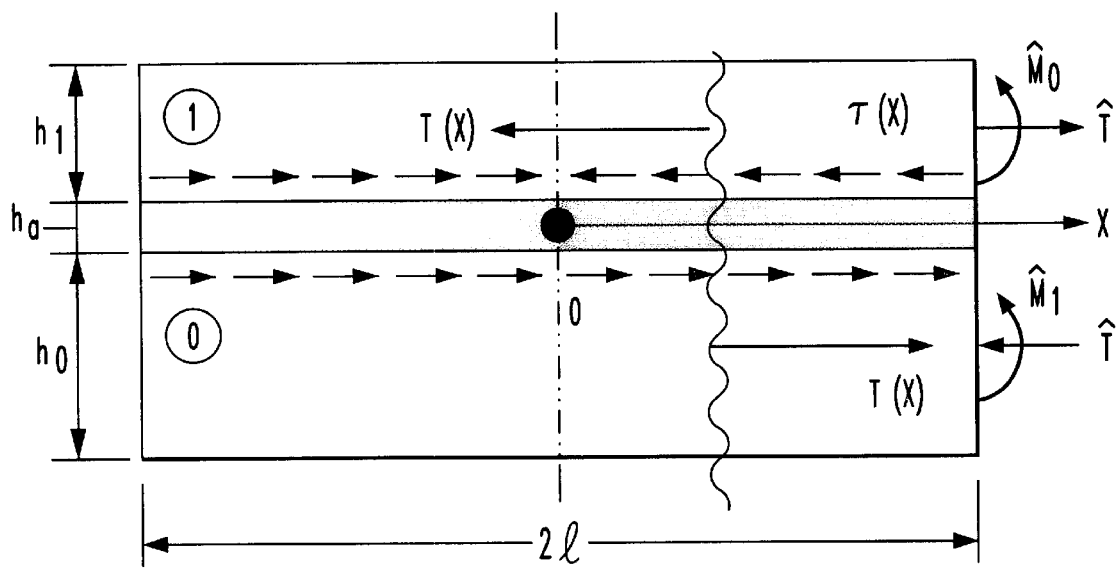
FIGS. 3a–b depict an adhesively bonded bi-material assembly, subjected to external shear.
Figure 3B:
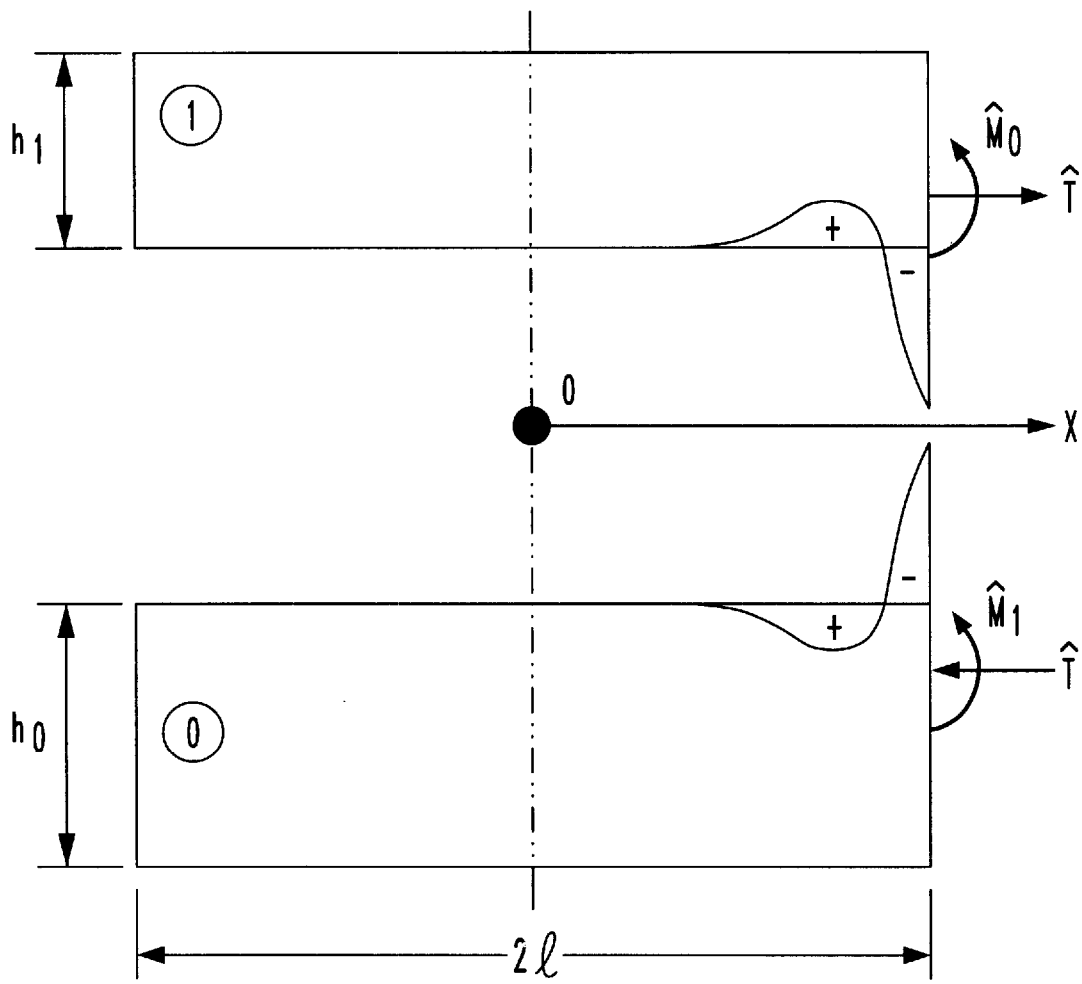
Figure 4:
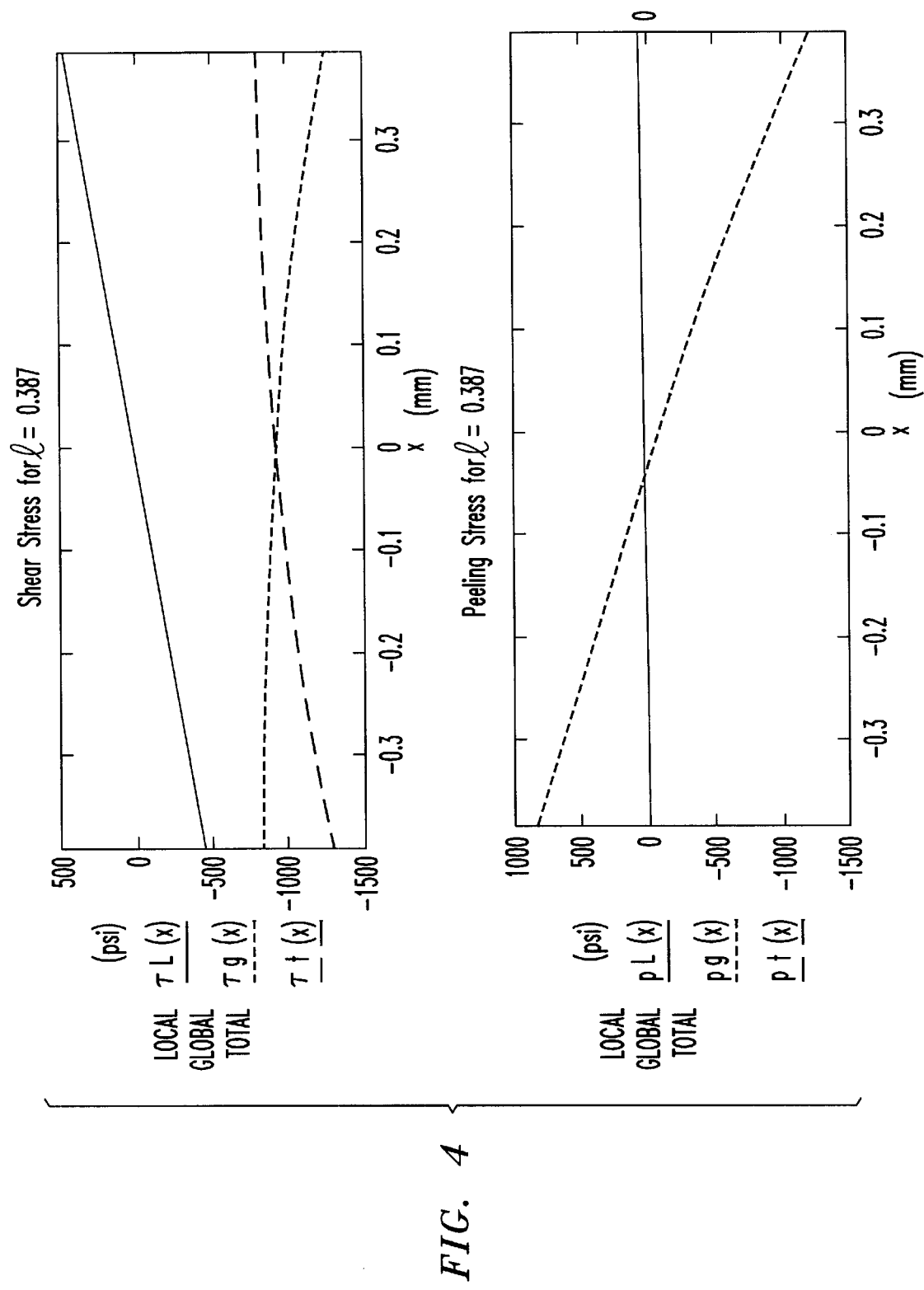
FIG. 4 depicts the shear stress and peeling stress for l=0.387 according to an illustrative embodiment of the invention.
Figure 5:
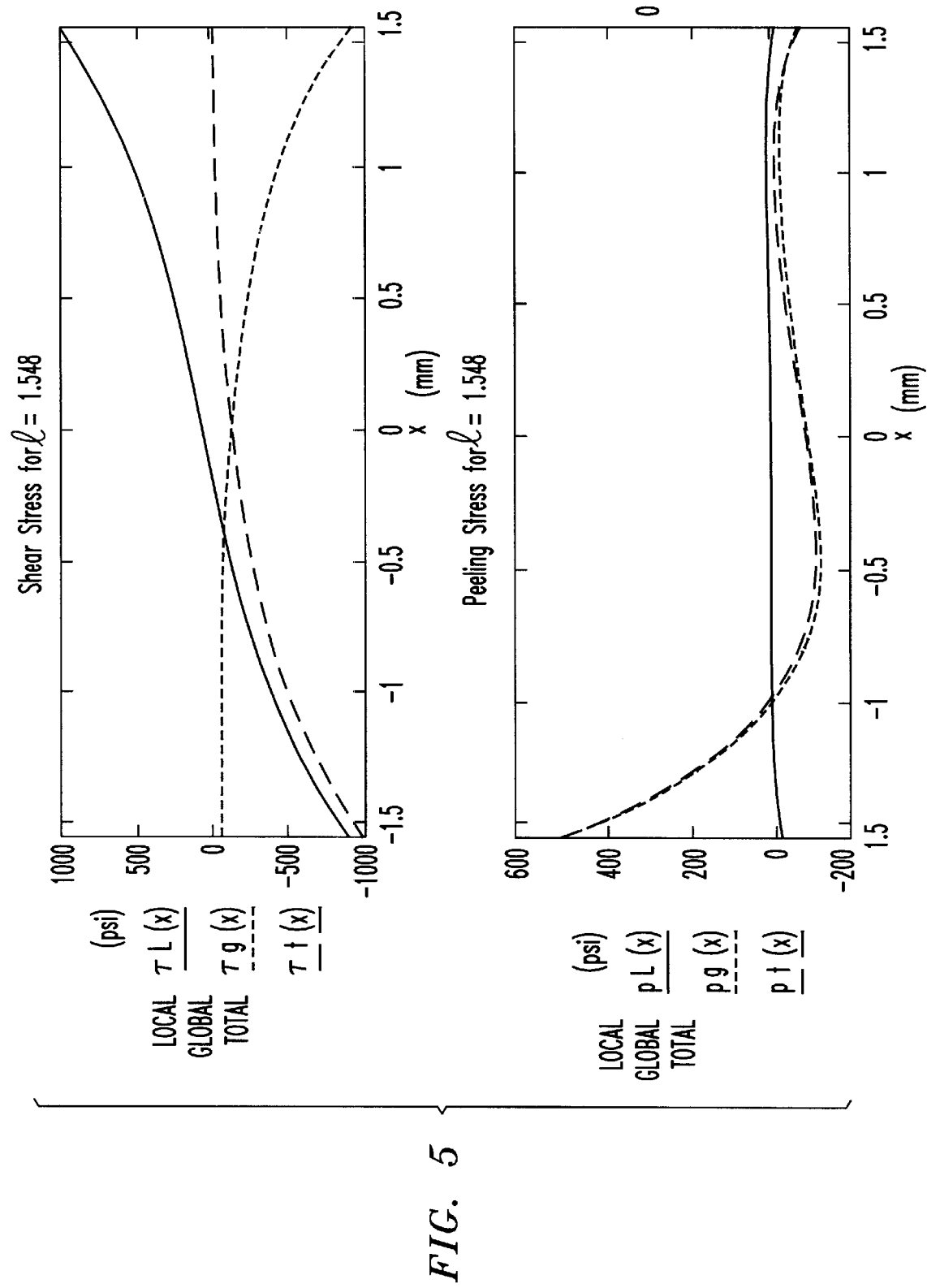
FIG. 5 depicts the shear stress and peeling stress for l=1.548 according to an illustrative embodiment of the invention.
Figure 6:
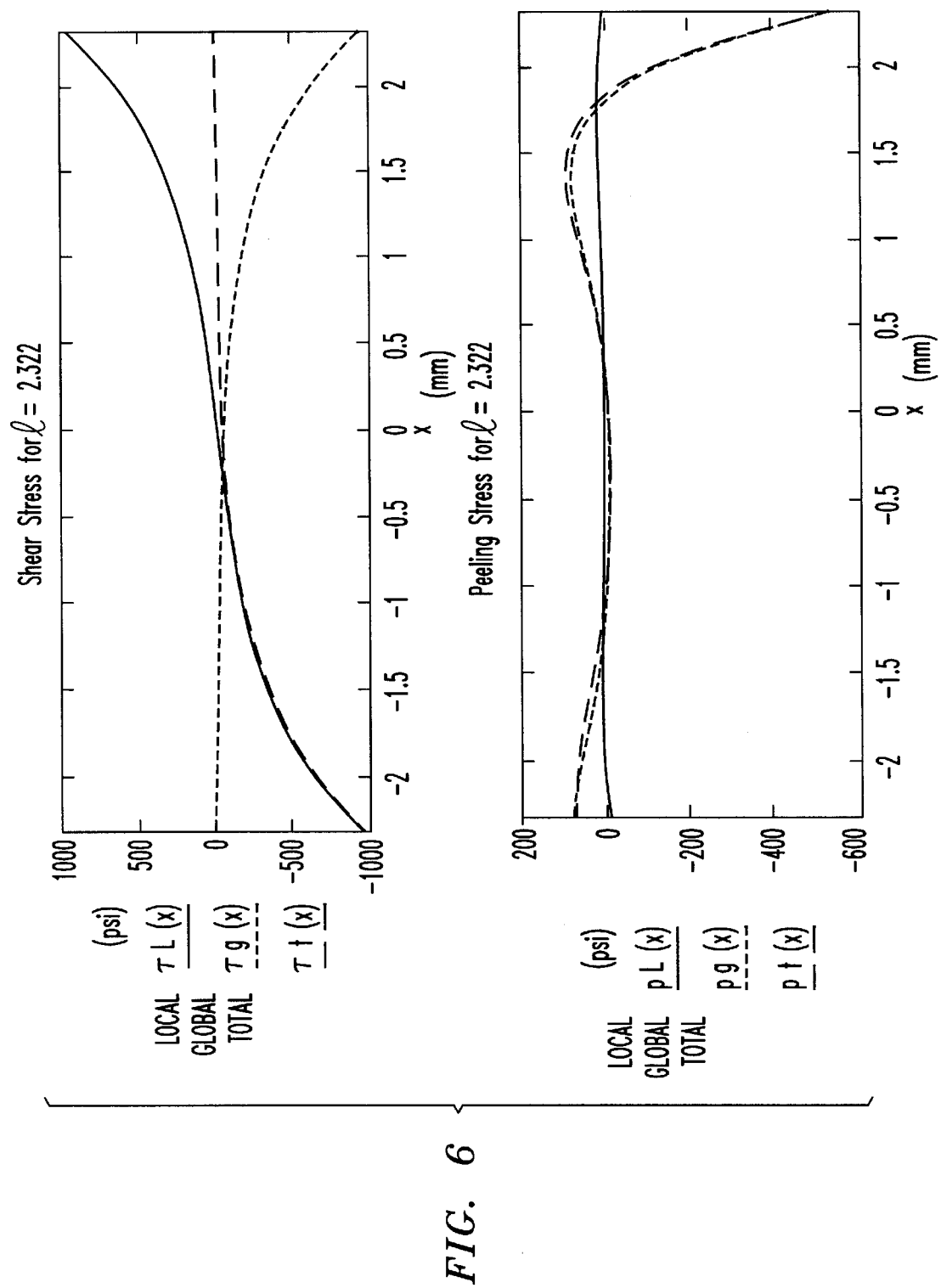
FIG. 6 depicts the shear stress and peeling stress for l=2.322 according to an illustrative embodiment of the invention.
Figure 7:
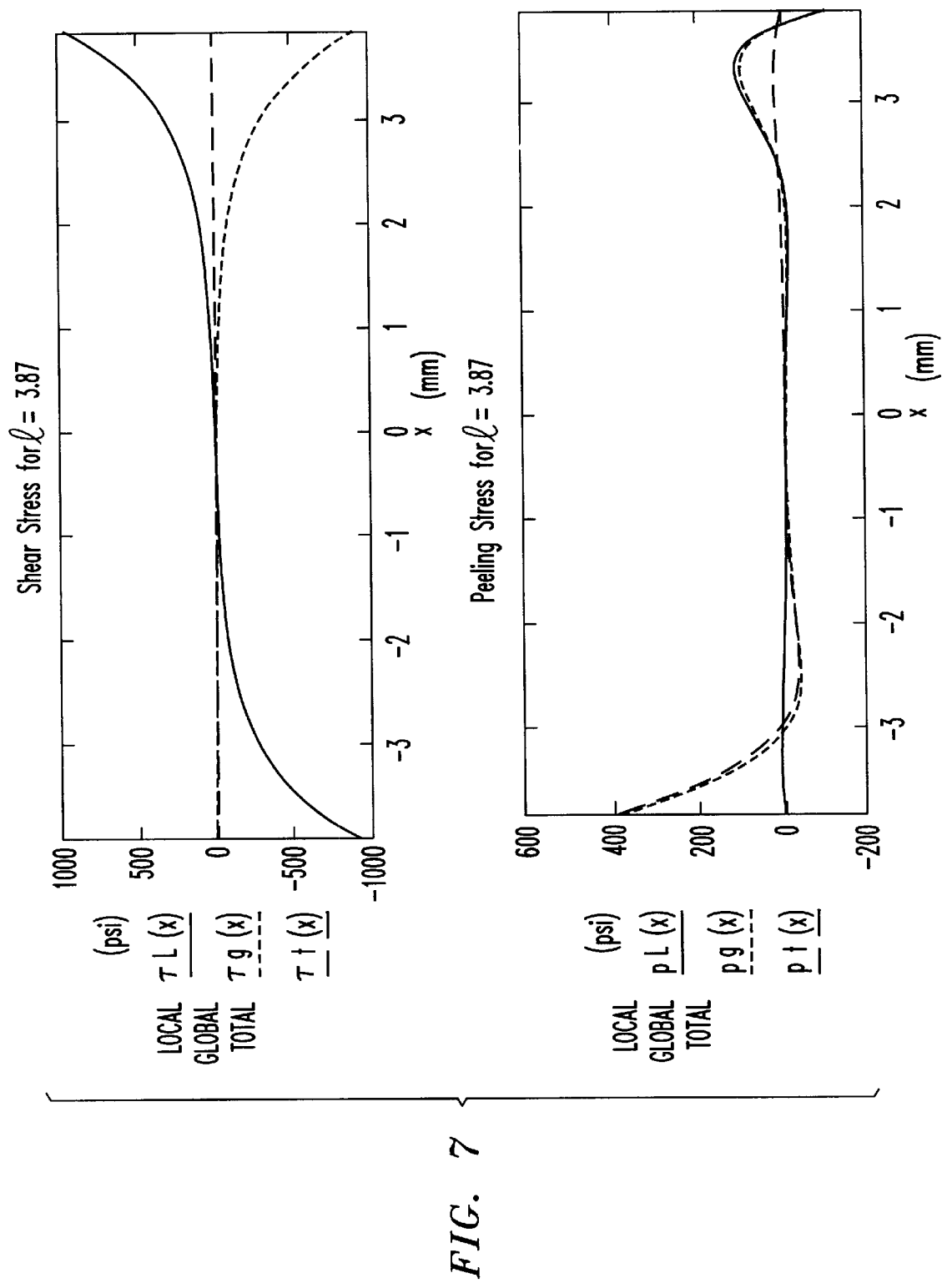
FIG. 7 depicts the shear stress and peeling stress for l=3.87 according to an illustrative embodiment of the invention.
Figure 8:
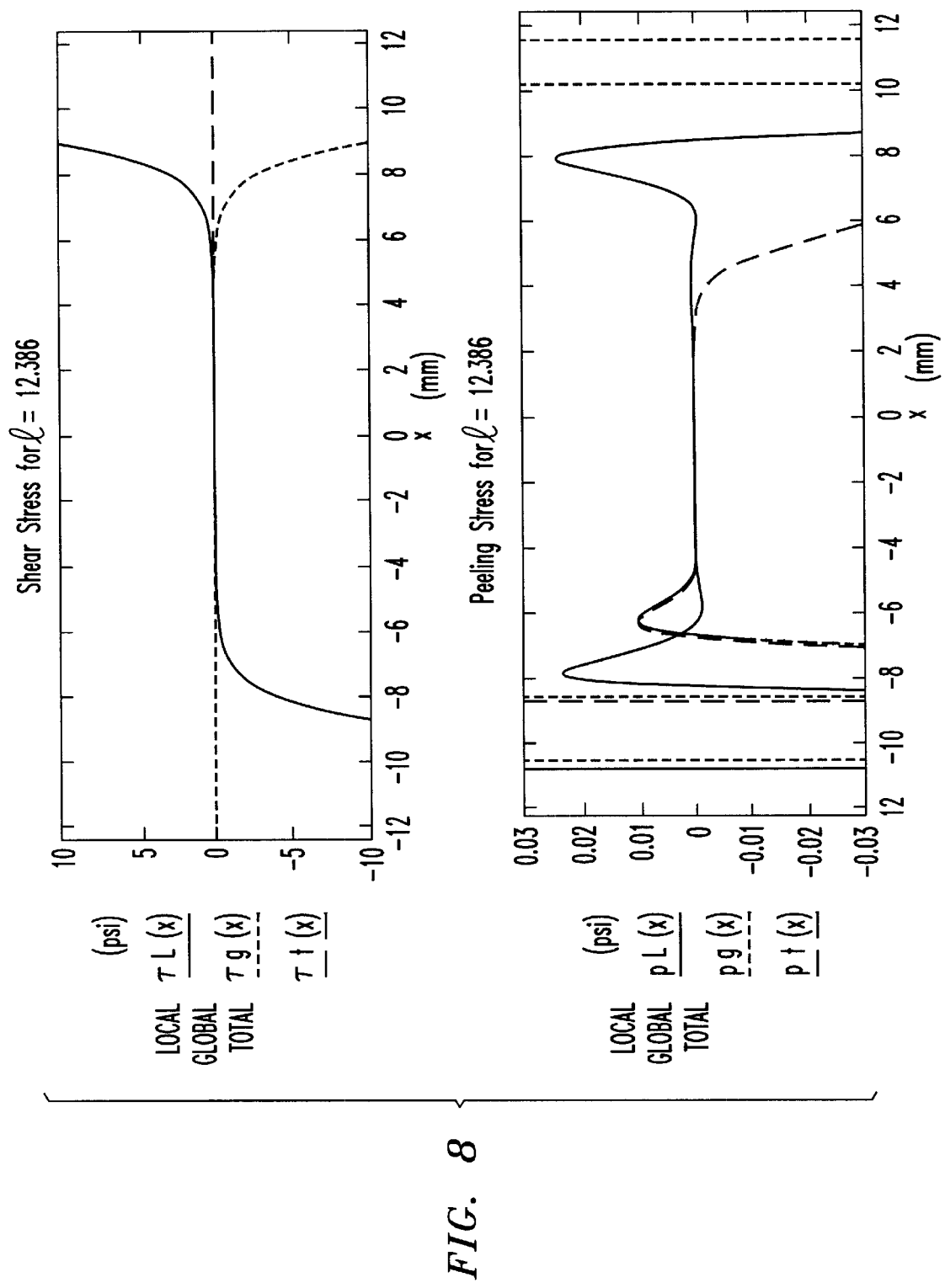
FIG. 8 depicts the shear stress and peeling stress for l=12.386 according to an illustrative embodiment of the invention.

FIGS. 3a–b depict an elongated adhesively bonded bi-material assembly, subjected to the external shearing forces, $\hat{T}$, and the equilibrating bending moments $$\hat{M}_0 = \hat{T} \frac{h_0 + h_1}{2D} D_0, \quad \hat{M}_1 = \hat{T} \frac{h_0 + h_1}{2D} D_1. \quad (49)$$

The forces, T(x), acting in the cross-sections of the adherends within the bonded joints can be found from the homogeneous equation $$T''(x) - k^2 T(x) = 0, \quad (50)$$

corresponding to the equation (23). The function T(x) must satisfy the conditions:

$$T(-l) = 0, \quad T(l) = -\hat{T}. \quad (51)$$

The differential equation (50) has the following solution:

$$T(x) = \bar{C}_0 \sin hkx + \bar{C}_1 \cos hkx, \quad (52)$$

where $\bar{C}_0$ and $\bar{C}_1$ are the constants of integration. Introducing the solution (52) into the conditions (51), and solving the obtained equations for the constants $\bar{C}_0$ and $\bar{C}_1$, yields:

$$\bar{C}_0 = -\frac{\hat{T}}{2\sinh kl}, \quad \bar{C}_1 = -\frac{\hat{T}}{2\cosh kl},$$

and the formula (52) yields:

$$T(x) = -\hat{T} \frac{\sinh[k(l+x)]}{\sinh 2kl}. \quad (53)$$

The shearing stress, $\tau(x)$, can be found by $$\tau(x) = T'(x) = -k\hat{T} \frac{\cosh[k(l+x)]}{\sinh 2kl}. \quad (54)$$

The solution to the equation (36) for the "peeling" stress can still be sought in the form (37), in which, however, the particular solution, expressed by the last term in (37), is different. Accordingly, the solution with respect to global thermally induced stresses is:

$$p(x) = \bar{A}_0 V_0(\beta x) + \bar{A}_1 V_1(\beta x) + \quad (55)$$

$$\bar{A}_2 V_2(\beta x) + \bar{A}_3 V_3(\beta x) - \mu \frac{k^2}{k^4 + 4\beta^4} \hat{T} \frac{\sinh[k(l+x)]}{\sinh 2kl}.$$

The constants $\bar{A}_i$, I=0, 1, 2, 3, of integration can be evaluated from the boundary conditions:

$$w_0''(-l) = w_1''(-l) = 0, \quad (56)$$

$$w_0'''(-l) = w_1'''(-l) = 0, \quad (57)$$

$$w_0''(l) = \frac{\hat{M}_0}{D_0}; \quad w_1''(l) = \frac{\hat{M}_1}{D_1}, \quad (58)$$

and $$w_0'''(l) = w_1'''(l) = 0. \quad (59)$$

and x=l of the adherends. The conditions (56) reflect the fact that there are no concentrated bending moments at the ends x=−l. The conditions (58) indicate that the external bending moments, $\hat{M}_0$ and $\hat{M}_1$, at the ends of the adherends must be equilibrated by the elastic moments, $D_0 w_0''(l)$ and $D_1 w_1''(l)$. The conditions (56)–(59) can be translated into the conditions for the "peeling" stress function, p(x), using the conditions (7) and (31), as follows $$p''(-l) = 0, \quad p'''(-l) = 0, \quad p'''(l) = 0, \quad (60)$$

$$\int_{-l}^{x} \int_{-l}^{x} p(\xi) d\xi d\xi' = -\frac{\mu}{4\beta^4} \hat{T}.$$

Here the parameters $\mu$ and $\beta$ are expressed by the formulas (33). Introducing the solution (55) into the conditions (60) and solving the obtained algebraic equations for the constants $\bar{A}_i$, i=0, 1, 2, 3, of integration yields:

$$\bar{A}_0 = -\mu \frac{\hat{T}}{\beta^2 \sqrt{2}} \frac{V_3(\beta l) + \frac{k^5 l}{k^4 + 4\beta^4} \left[ \frac{2V_3(\beta l)}{\sinh 2kl} + \frac{V_0(\beta l)}{\beta l \sqrt{2}} \tanh kl \right]}{\sinh 2\beta l + \sin 2\beta l} \quad (61)$$

$$\bar{A}_1 = \mu \frac{\hat{T}}{\beta^2 \sqrt{2}} \frac{V_0(\beta l) + \frac{k^5 l}{k^4 + 4\beta^4} \left[ \frac{2V_0(\beta l)}{\sinh 2kl} - \frac{V_1(\beta l)}{\beta l \sqrt{2}} \cotanh kl \right]}{\sinh 2\beta l - \sin 2\beta l}$$

$$\bar{A}_2 = \mu \frac{\hat{T}}{\beta^2 \sqrt{2}} \frac{V_1(\beta l) + \frac{k^5 l}{k^4 + 4\beta^4} \left[ \frac{2V_1(\beta l)}{\sinh 2kl} - \frac{V_2(\beta l)}{\beta l \sqrt{2}} \tanh kl \right]}{\sinh 2\beta l + \sin 2\beta l}$$

$$\bar{A}_3 = \mu \frac{\hat{T}}{\beta^2 \sqrt{2}} \frac{V_2(\beta l) + \frac{k^5 l}{k^4 + 4\beta^4} \left[ \frac{2V_2(\beta l)}{\sinh 2kl} - \frac{V_3(\beta l)}{\beta l \sqrt{2}} \cotanh kl \right]}{\sinh 2\beta l - \sin 2\beta l}$$

For sufficiently large and/or stiff assemblies, the formulas (61) can be simplified:

$$\overline{A}_0 = -\mu \frac{\hat{T}}{2\beta^2} e^{-\beta l} \left[ \cos\beta l - \sin\beta l + \frac{k^5}{(k^4 + 4\beta^4)\beta} \cos\beta l \right] \quad (62)$$

$$\overline{A}_1 = \mu \frac{\hat{T}}{2\beta^2} e^{-\beta l} \left[ \sqrt{2} \cos\beta l - \frac{k^5}{\sqrt{2}(k^4 + 4\beta^4)\beta}(\cos\beta l + \sin\beta l) \right]$$

$$\overline{A}_2 = \mu \frac{\hat{T}}{2\beta^2} e^{-\beta l} \left[ \cos\beta l + \sin\beta l - \frac{k^5}{(k^4 + 4\beta^4)\beta} \sin\beta l \right]$$

$$\overline{A}_3 = \mu \frac{\hat{T}}{2\beta^2} e^{-\beta l} \left[ \sqrt{2} \cos\beta l - \frac{k^5}{\sqrt{2}(k^4 + 4\beta^4)\beta}(\cos\beta l - \sin\beta l) \right]$$

For such assemblies, the formulas (53), (54) and (55), considering the formulas (62), yield:

$$T(x) = -\hat{T} e^{-k(l-x)}, \quad \tau(x) = -k\hat{T} e^{-k(l-x)}, \quad (63)$$

and $$p(x) = \mu \frac{\hat{T}}{2\beta^2} \left\{ e^{-\beta(l-x)} \left[ \sin(\beta(l+x)) - \frac{k^5}{(k^4 + 4\beta^4)} \cos(\beta(l-x)) \right] - 2e^{-k(l-x)} \frac{k^2\beta^2}{k^4 + 4\beta^4} \right\}, \quad (64)$$

so that $$T(l) = -\hat{T}, \quad \tau(l) = -k\hat{T}, \quad (65)$$

$$p(l) = \mu \frac{\hat{T}}{2\beta^2} \left[ \sin 2\beta l - \frac{k^3 + 2\beta^3}{(k^4 + 4\beta^4)\beta} k^2 \right],$$

$$T(-l) = -\hat{T} e^{-2kl}, \quad \tau(-l) = k\hat{T} e^{-2kl}, \quad (66)$$

and $$p(-l) = -\mu \frac{\hat{T}}{2\beta^2} \left[ e^{-2\beta l} \frac{k^5 \cos\beta l}{(k^4 + 4\beta^4)\beta} + 2e^{-2kl} \frac{k^2\beta^2}{k^4 + 4\beta^4} \right]. \quad (67)$$

The forces, $\hat{T}$, acting in the assembly components within the unbonded midportion of the assembly, can be determined from the condition $$\kappa\tau(l) = (\Delta\alpha\Delta t - \lambda\hat{T})L \quad (68)$$

of the compatibility of the relative longitudinal interfacial displacements of the adherends at the inner (outer) cross-section of the bonded (unbonded) portion of the assembly. In the condition (68), $\kappa$ is the total interfacial compliance of the assembly, which is defined by the formula (14), $$\tau(l) = k \frac{\Delta\alpha\Delta t}{\lambda} \tanh kl - k\hat{T} \coth 2kl \quad (69)$$

is the total interfacial shearing stress at the cross-section x=l (this formula can be obtained from the formulas (30) and (54) for the "local" and the "global" shearing stresses, respectively); $\Delta\alpha\Delta t$ is the "external" (stress-free) strain; $\lambda$ is the total axial compliance of the assembly, defined by the formula (25); and L is half the length of the unbonded midportion of the assembly. The left part of the condition (68) is the relative displacement of the adherends at the inner edge of the bonded area. The right part is the relative displacement of the adherends at the ends of the unbonded portion of the assembly, i.e. at the same cross-section.

Solving the condition (68), with consideration of the expression (69), for the $\hat{T}$ value, yields:

$$\hat{T} = \frac{\Delta\alpha\Delta t}{\lambda} \frac{kL - \tanh kl}{kL - \coth 2kl} = \hat{T}_0 \Phi(kl, kL), \quad (70)$$

where $$\hat{T}_0 = \frac{\Delta\alpha\Delta t}{\lambda} \tanh 2kl = -T_\infty \left( 1 - \frac{1}{\cosh 2kl} \right) \quad (71)$$

is the thermally induced force in the case of a substantially continuous adhesive layer (for large enough kl values this force is equal to the force $T_{28}$, defined by the formula (27)), and the factor $$\Phi(kl, kL) = \frac{kL \coth kl - 1}{kL \tanh 2kl - 1} \quad (72)$$

considers the effect of the finite length, 2L, of the unbonded portion of the assembly on the magnitude of the "global" force, $\hat{T}$. This factor changes from "one" to $$\Phi_\infty = \coth kl \coth 2kl = \frac{T_\infty}{\hat{T}_0} = \frac{1}{1 - \frac{1}{\cosh 2kl}}, \quad (73)$$

when the length, 2L, of the unbonded portion changes from zero to infinity. As is evident from the formula (73), the "global" force, $\hat{T}$, is equal to the force, $$T_\infty = \frac{\Delta\alpha\Delta t}{\lambda},$$

taking place in the case of a substantially continuous adhesive layer, not only when the length, 2L, of the unbonded midportion is small, but also when the lengths, 2l, and/or the stiffness, k, of the bonded portions are large, no matter how long the unbonded portion might be. This conclusion can be drawn also directly from the formula (72). When the kl value is large (say, kl>3.0), the factor $\Phi$ is close to "one" for any kL value.

With the expression (70) for the "global" thermally induced force, $\hat{T}$, in the unbonded midportion, the formula (53) for the "global" force, T(x), acting in the bonded joint, maybe expressed as $$T(x) = -T_\infty \frac{kL - \tanh kl}{kL - \coth 2kl} \frac{\sinh[k(l+x)]}{\sinh 2kl}. \quad (74)$$

The corresponding interfacial shearing stress can be obtained by differentiation:

$$\tau(x) = T'(x) = -kT_\infty \frac{kL - \tanh kl}{kL - \coth 2kl} \frac{\cosh[k(l+x)]}{\sinh 2kl}. \quad (75)$$

This formula yields:

$$\tau(-l) = -kT_\infty \frac{kL - \tanh kl}{kL - \coth 2kl} \frac{1}{\sinh 2kl}$$
$$\tau(l) = -kT_\infty \frac{kL - \tanh kl}{kL \tanh 2kl - 1}$$
(76)

As to the "global" "peeling" stress, it can be evaluated without difficulties, as long as the force $\hat{T}$ is determined.

Stresses in the Bonded Joints due to the Combined Action of the "Local" and "Global" Loading (Stresses)

The total interfacial shearing stress, $\tau_t(x)$, due to the combined action of the "local" and the "global" thermal expansion (contraction) mismatch can be found on the basis of the equations (30) and (75) as follows:

$$\tau_t(x) = kT_\infty \left[ \frac{\sinh kx}{\cosh kl} - \frac{kL - \tanh kl}{kL - \coth 2kl} \frac{\cosh(k(l+x))}{\sinh 2kl} \right]$$
(77)

The expression for the forces, T(x), acting in the adherends within the bonded areas, can be obtained by integration:

$$T_t(x) = -T_\infty \left[ 1 - \frac{\cosh kx}{\cosh kl} + \frac{kL - \tanh kl}{kL - \coth 2kl} \frac{\sinh(k(l+x))}{\sinh 2kl} \right]$$
(78)

The shearing stress at the outer (x=-l) and the inner (x=l) edges of the bonded joints are $$\tau_t(-l) = \tau_{max}^o \chi_-(kl, kL), \tau_t(l) = \tau_{max}^o \chi_+(kl, kL),$$
(79)

where $$\tau_{max}^o = -kT_\infty \tan h2kl$$
(80)

is the maximum shearing stress in the case of the continuous adhesive layer (L=0), and the factors $$\chi_-(kl, kL) = \frac{1 - kL\left(\tanh kl + \frac{1}{\sinh 2kl}\right)}{1 - kL \tanh 2kl}$$
$$\chi_+(kl, kL) = kL \frac{\tanh kl - \coth 2kl}{1 - kL \tanh 2kl} = \frac{kL/\sinh 2kl}{kL \tanh 2kl - 1}$$
(81)

consider the effect of the finite length, 2L, of the unbonded midportion of the assembly on the total shearing stresses at the ends, x=-l and x=l, of the bonded area. The factor $\chi_-$ changes from "one" to $$\chi_-^\infty = \coth 2kl\left(\tanh 2kl - \frac{1}{\sinh 2kl}\right),$$
(82)

when the length, 2L, of the unbonded midportion changes from zero to infinity. As evident from the formula (82), the factor $\chi_-^\infty$ can be close to "one" even in the case of a very long unbonded area, if the kl value is large enough (say, kl>3). The factor $\chi_+$ changes from zero to $$\chi_+^\infty = \frac{\coth 2kl}{\sinh 2kl},$$
(83)

when the length, 2L, of the unbonded area changes from zero to infinity. As evident from the formula (83), the factor $\chi_+^\infty$ can be close to zero even in the case of a very long unbonded midportion, if the kl value is sufficiently large. This means, in particular, that the relative displacements of the adherends within the unbonded area (these displacements significantly affect the strength of the solder joints, if any, located within the unbonded area) can be made, if necessary, next to zero, for any length of unbonded area, by employing long enough adhesive bonds.

EXAMPLE

A numerical example is carried out for an assembly, whose total length, as shown in FIG. 1, is $2L_0=2L+4l=1.8898$ in. The drop in temperature is $\Delta t=100°$ C. The following input data for the materials properties are used: $E_0=17.5 \times 10^6$ psi, $v_0=0.24$, $\alpha_0=3.2 \times 10^6$ 1/° C., $E_1=5.70 \times 10^6$ psi, $v_1=0.22$, $\alpha_1=6.5 \times 10^6$ 1/° C., $E_a=0.4 \times 10^6$ psi, $v_a=0.4$. The adherends, for example silicon and alumina, have thicknesses $h_0=h_1=0.5$ mm, and the adhesive layer has a thickness $h_a=2$ mil≈0.005 mm. The calculated data are plotted in FIGS. 4–8 and shown in the table included as FIG. 9. FIGS. 4–8 depict peeling and shear stress each for l=1.548, l=2.322, l=3.87, and l=12.386, respectively. As evident from the calculated data, a 2l=2.0 mm long (wide) adhesive layer is sufficient to ensure the level of stresses and displacements to be substantially the same as in an assembly with a substantially continuous adhesive layer.

The analysis provides formulas for the evaluation of the stresses and displacements in a bi-material assembly, adhesively bonded at the ends and subjected to a change in temperature.

The formulas show that if the bonded areas are made long enough, the mechanical behavior of the assembly, in terms of the induced stresses and displacements, will be substantially the same as the behavior of an assembly with a substantially continuous adhesive layer. The analytical results are particularly useful in the analysis and design of bi-material assemblies in micro-electronics and photonics.

As shown above, a desired assembly length is chosen and the bonded area for strength corresponding to that of an assembly with a continuous adhesive layer is calculated. Local shearing stress is calculated from formula 30. λ is obtained from formula 25 and $\lambda_0$ and $\lambda_1$ from formula 1. Local peeling stresses are calculated from formula 37 with x=l. To obtain the maximum displacement, κ is multiplied by the global shearing stress in the cross-section at θ. The global shearing stress is obtained by equation 54 with x=l. $\hat{T}$ is calculated from formula 54 and, $\hat{T}_0$ is obtained from formula 71. Equation 72 is used to obtain the final length of the bonded and unbonded areas. The total shearing stress is obtained from formula 77. The total peeling stress is obtained from the local peeling stress from equation 37 plus the global stress from equation 55 with x=l for both.

Shearing and peeling stresses are calculated for l values until an l value is obtained wherein the magnitude of the local interfacial shearing stress at the inner edge of the bonded area is substantially equal to the magnitude of the global interfacial shearing stress at the inner edge of the bonded area. (The inner edge of the bonded area is depicted in FIG. 1 as 108). When this condition is satisfied, the strength of the assembly will be substantially the same as a like structure wherein 2l substantially equals half of the assembly length, or in other words, the assembly has a substantially continuous adhesive layer. Accordingly, the difference between the inner edge local interfacial shearing stress magnitude and the inner edge global interfacial shearing stress magnitude can be determined for values of a l until a difference of zero is obtained, indicating the desired value of l.

The bi-material assembly as described herein may comprise a portion of a multi-material assembly. In an illustrated embodiment of the invention a semiconductor device comprises a bi-material assembly. Any semiconductor device may be fabricated as described herein with illustrative embodiments including, but not limited to, a photonic device and MEMS device.

The adherends may be any materials for which the calculations provided herein may be performed. In an exemplary embodiment of the invention at least one adherend comprises a semiconductor material and may be, for example silicon, gallium arsenide, and lithium niobate. In a further illustrative embodiment one adherend is a ceramic, for example, alumina.

In an exemplary embodiment of the invention the shearing stresses are substantially due to a temperature change. Any temperature change may produce such shearing stresses. An illustrative example is a range of about 50° C. to about 200° C.

While the invention has been described by illustrative embodiments, additional advantages and modifications will occur to those skilled in the art. Therefore, the invention in its broader aspects is not limited to specific details shown and described herein. Modifications, for example, to materials and applications, may be made without parting from the spirit and scope of the invention. Accordingly, it is intended that the invention not be limited to the specific illustrative embodiments, but be interpreted within the full spirit and scope of the appended claims and their equivalents.

What is claimed is:

1. A bi-material assembly comprising two adherends, said assembly having a length defined by an interface between said two adherends, said adherends adhesively bonded in first and second bonded areas consisting of a length of 2l at first and second ends of the length of the bonded assembly, respectively, said first and second bonded areas defining an unbonded area therebetween, wherein 2l is less than half of the assembly length, said first and second bonded areas each defining an inner edge where said bonded area and said unbounded area meet and wherein the inner edge local interfacial shearing stress substantially equal in magnitude to the inner edge global interfacial shearing stress, whereby the strength of the bi-material bonded assembly is substantially the same as a like structure wherein 2l equals half the length of the assembly.

2. The bi-material assembly of claim 1 wherein at least one adherend comprises a semiconductor material.

3. The bi-material assembly of claim 2 wherein at least one adherend is silicon.

4. The bi-material assembly of claim 1 wherein at least one adherend is a ceramic.

5. The bi-material assembly of claim 4 wherein at least one adherend is alumina.

6. The bi-material assembly of claim 1 wherein the shearing stresses are substantially due to a temperature change.

7. The bi-material assembly of claim 6 wherein the temperature change is in the range of about 50° C. to about 200° C.

8. A semiconductor device comprising a bi-material assembly according to claim 1.

9. The semiconductor device of claim 8 wherein the device is a photonic device.

10. The semiconductor device of claim 8 wherein the device is a MEMS device.

11. A multi-material assembly comprising at least one bi-material assembly according to claim

* * * * *